(12) United States Patent
Harned et al.

(10) Patent No.: US 7,643,128 B2
(45) Date of Patent: *Jan. 5, 2010

(54) LARGE FIELD OF VIEW PROJECTION OPTICAL SYSTEM WITH ABERRATION CORRECTABILITY

(75) Inventors: Robert D. Harned, Redding, CT (US); Cheng-Qun Gui, Best (NL); Pieter Willem Herman De Jager, Rotterdam (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/646,609

(22) Filed: Dec. 28, 2006

(65) Prior Publication Data

US 2007/0195304 A1    Aug. 23, 2007

Related U.S. Application Data

(63) Continuation of application No. 10/831,210, filed on Apr. 26, 2004, now Pat. No. 7,158,215.

(60) Provisional application No. 60/483,220, filed on Jun. 30, 2003.

(51) Int. Cl.
*G03B 27/00* (2006.01)
*G03B 27/70* (2006.01)

(52) U.S. Cl. .......................................... 355/66; 355/51

(58) Field of Classification Search .................. 355/51, 355/53, 55, 57, 60, 66, 67; 359/366, 727, 359/730, 731; 345/12

See application file for complete search history.

(56) References Cited

U.S. PATENT DOCUMENTS

| 3,748,015 | A | 7/1973 | Offner |
| 3,821,763 | A | 6/1974 | Scott |
| 4,240,707 | A | 12/1980 | Wetherell et al. |
| 4,293,186 | A | 10/1981 | Offner |
| 4,650,315 | A | 3/1987 | Markle |
| 4,688,904 | A | 8/1987 | Hirose et al. |

(Continued)

FOREIGN PATENT DOCUMENTS

EP    0 744 665 A1    11/1996

(Continued)

OTHER PUBLICATIONS

Search Report for Singapore App. No. 200403806-3, dated Nov. 29, 2004, 5 pages.

(Continued)

*Primary Examiner*—Rodney E Fuller
(74) *Attorney, Agent, or Firm*—Sterne, Kessler, Goldstein & Fox P.L.L.C.

(57) ABSTRACT

An exposure system for manufacturing flat panel displays (FPDs) includes a reticle stage adapted to support a reticle. A substrate stage is adapted to support a substrate. A reflective optical system is adapted to image the reticle onto the substrate. The reflective optical system includes a primary mirror including a first mirror and a second mirror, and a secondary mirror. The reflective optical system has sufficient degrees of freedom for both alignment and correction of third order aberrations when projecting an image of the reticle onto the substrate by reflections off the first mirror, the secondary mirror, and the second mirror.

26 Claims, 11 Drawing Sheets

U.S. PATENT DOCUMENTS

| | | |
|---|---|---|
| 4,693,569 A | 9/1987 | Offner |
| 4,701,035 A | 10/1987 | Hirose |
| 4,711,535 A | 12/1987 | Shafer |
| 4,743,112 A | 5/1988 | Burke |
| 4,747,678 A | 5/1988 | Shafer et al. |
| 4,769,680 A | 9/1988 | Resor, III et al. |
| 4,798,450 A | 1/1989 | Suzuki |
| 4,834,517 A | 5/1989 | Cook |
| 5,153,898 A | 10/1992 | Suzuki et al. |
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,530,516 A | 6/1996 | Sheets |
| 5,579,147 A | 11/1996 | Mori et al. |
| 5,625,436 A | 4/1997 | Yanagihara et al. |
| 5,677,703 A | 10/1997 | Bhuva et al. |
| 5,710,619 A | 1/1998 | Jain et al. |
| 5,808,797 A | 9/1998 | Bloom et al. |
| 5,880,834 A | 3/1999 | Chrisp |
| 5,982,553 A | 11/1999 | Bloom et al. |
| 6,033,079 A | 3/2000 | Hudyma |
| 6,118,577 A | 9/2000 | Sweatt et al. |
| 6,133,986 A | 10/2000 | Johnson |
| 6,177,980 B1 | 1/2001 | Johnson |
| 6,226,346 B1 | 5/2001 | Hudyma |
| 6,229,525 B1 | 5/2001 | Alexander |
| 6,229,595 B1 | 5/2001 | McKinley et al. |
| 6,636,350 B2 | 10/2003 | Shafer et al. |
| 6,687,041 B1 | 2/2004 | Sandstrom |
| 6,707,603 B2 | 3/2004 | Ansley et al. |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,879,383 B2 | 4/2005 | Mercado |
| 7,158,215 B2 | 1/2007 | Harned et al. |
| 7,184,124 B2 | 2/2007 | Harned et al. |
| 2003/0007572 A1 | 1/2003 | Ohmatsu |
| 2003/0137644 A1 | 7/2003 | Tanaka et al. |
| 2004/0041104 A1 | 3/2004 | Liebregts et al. |
| 2004/0130561 A1 | 7/2004 | Jain |
| 2004/0160666 A1 | 8/2004 | Hudyma |
| 2004/0218162 A1 | 11/2004 | Whitney |
| 2004/0263429 A1 | 12/2004 | Harned et al. |
| 2005/0007572 A1 | 1/2005 | George et al. |
| 2005/0128573 A1 | 6/2005 | Merz |
| 2005/0237505 A1 | 10/2005 | Harned et al. |
| 2006/0139745 A1 | 6/2006 | Gui et al. |

FOREIGN PATENT DOCUMENTS

| | | |
|---|---|---|
| EP | 0947882 A2 | 10/1999 |
| JP | 48-012039 | 2/1973 |
| JP | 61-047917 | 3/1986 |
| JP | 9-146281 | 6/1997 |
| JP | 2001-290279 | 10/2001 |
| WO | WO 98/33096 | 7/1998 |
| WO | WO 98/38597 | 9/1998 |

OTHER PUBLICATIONS

Hodge et al., "An 11.8-in Flat Panel Display Monitor", Hewlett-Packard Journal, vol. 46, No. 4, Article 8, pp. 51-60, Aug. 1995.

Search Report for European App. No. EP 04 01 4897, dated Feb. 2, 2007, 4 pages.

English Translation of *Notification of Reason(s) for Refusal*, from Japanese Patent Appl. No. 2004-19450, 3 pages, dispatched Jul. 17, 2007.

Written Opinion from Singapore Appl. No. 200403806-3, dated Jul. 31, 2007, 4 pages.

Translation of Office Action for Japanese Patent Application No. 2004-194590 mailed on Feb. 12, 2008, 2 pgs.

LARGE FIELD OF VIEW PROJECTION OPTICAL SYSTEM WITH ABERRATION CORRECTABILITY

CROSS REFERENCE TO RELATED APPLICATIONS

This application is a continuation of U.S. application Ser. No. 10/831,210, filed Apr. 26, 2004 (issuing as U.S. Pat. No. 7,158,215 on Jan. 2, 2007), which claims benefit under 35 U.S.C. §119(e) to U.S. Provisional Patent Application No. 60/483,220, filed Jun. 30, 2003, which are incorporated by reference herein in their entireties.

This application is related to U.S. application Ser. No. 10/921,097 (i.e., the '097 application is a continuation-in-part of the '210 application), filed Aug. 19, 2004, which is incorporated by reference herein in its entirety.

BACKGROUND OF THE INVENTION

1. Field of the Invention

The present invention relates to projection optical systems used in printing circuit patterns during the manufacture of large flat panel displays (FPD), and more particularly, to an optical design form that is relatively compact, provides aberration and magnification correction and facilitates a high FPD production rate.

2. Related Art

The manufacture of a liquid crystal display, or a flat panel display (FPD) involves a manufacturing process that is similar to that used in the integrated circuit (IC) industry where computer chips are produced. An exposure system is used to project an image of a reticle containing a circuit pattern so as to expose a photo resist coated substrate. The actual circuit is created after the exposed substrate is processed using standard microlithographic processes. Depending on the particular FPD design this exposure process may be repeated many times on one substrate using reticles with different circuit designs. When all the exposures and microlithographic processing steps have been completed so the desired circuit pattern has been created, the substrate is integrated with other components to create a flat panel display screen.

Although FPDs have been in production since the late 1980s, the current size requirement are for FPDs of up to 42 inches diagonal, with 54 and 60 inches diagonal under development. This places severe requirements on the optics used in the projection optical system. Specifically, many existing optical design forms, if scaled up to 42 inch (and larger) FPD manufacturing size, become unreasonably large, especially from an optical manufacturing and packaging perspective.

Two different imaging processes are conventionally used to lithographically print circuits on flat panel display screens. Lithography tools described in U.S. Pat. Nos. 5,625,436, 5,530,516, 4,769,680 and 5,710,619 create the full circuit by stitching together images of small areas of the FPD circuit design. While acceptable quality and cost FPD screens up to 18 inches have been produced using the stitching imaging technique, the errors inherent in stitching have resulted in a very low product yield during manufacturing of larger displays and marginally acceptable quality. Because of the low yield, the production cost for large FPD televisions has been at an unacceptably high level from the FPD manufacturers' marketing perspective. As a result of the residual stitching errors the quality level of FPD televisions has not been that much better than conventional televisions for consumers to justify the high cost of an FPD television.

The major problem encountered in stitching is that the adjacent small images that create the full FPD circuit pattern are not aligned to each other. There are many sources of pattern alignment errors in optical imaging configurations. However, most of the errors are related to the imaging process requiring the use of multiple lens systems and masks. Misalignment errors result in electrical connection problems in the FPD circuit and/or an image on the screen that has visually displeasing discontinuities. No good solutions have been found to completely eliminate the problems associated with stitching. As a result, FPD manufactures prefer full field imaging or scanning systems to any optical design configuration that employs stitching.

Optical designs, operating at 1× or at some other magnification, compatible with producing 42-inch full field scanners, require very large lenses and/or mirrors. To print 42-inch FPDs, the lithography tool must have a minimum slit height of about 525 mm. (Note that while in the United States, screen dimensions are usually specified using the English system, while optical design and tool dimensioning is usually done in metric.) The requirement that the optical design form be telecentric results in at least one element in the optical design being 525 mm in diameter and more, typically at least 1,200 mm for the FPD manufacturers preferred optical design form.

For 1× refractive and catadioptric design forms, a minimum of a dozen and as many as several dozen lenses and mirrors are required. It is extremely difficult and very costly to achieve the optical performance required for printing 42 inch and larger FPD circuits using optical designs with refractive elements due to chromatic aberration in the refractive elements and problems with index of refraction homogeneity in the lens material. Even if an optical design is optimized to minimize chromatic aberration, there is a practical limit on the usable spectral bandwidth of the source. The reduced usable spectral bandwidth results in less available light to expose the photoresist. As a result, refractive and catadioptric manufacturing tools produce fewer FPDs per hour then optical design forms that do not suffer from chromatic aberration. The lower production rate results in higher costs for FPD televisions.

In addition to cost disadvantages, the image quality and distortion of refractive and most catadioptric design forms are compromised by the lens material's inhomogeneity, which degrades image quality and introduces distortion. While lens material inhomogeneity errors can be partially compensated for during glass production, or in the lens optical fabrication process, both methods add significant costs. In optical design, a system optimized to minimize the physical size of the lenses has many elements, while a design optimized to have just a few elements will have very large elements. However, in either of those scenarios, the total thickness of glass required in both designs will result in unacceptable inhomogeneity-related problems. As a result, optical design forms for tools to produce FPDs of approximately 24 inches and larger, which make extensive use of refractive materials, are extremely expensive to manufacture or cannot be built because the quality level glasses are not readily available.

Reflective optical design forms operating at 1× magnification are successfully being used in the microlithography industry, including the production of FPDs. An ASML Micralign design form first described in U.S. Pat. No. 3,748, 015, which is shown in FIG. 1A, has been used in manufacturing of 32 inch FPD. The design in FIG. 1A has two spherical mirrors, a primary concave mirror 101, and a secondary convex mirror 102. Note that, as shown in FIG. 1A, the primary mirror is used as a reflector twice. A reticle 103, that has the desired FPD circuit pattern drawn on it, is positioned off axis with respect to the optical system's optical axis. The image of the reticle 103 is projected onto a substrate 104 located symmetrically on the opposite side of the optical axis as the reticle. In this design form, the two spherical mirrors are configured to have good image quality and low distortion over an annular field (an annular field optical design concept is described in U.S. Pat. No. 3,821,763). Aberrations in this design are corrected by using concentric optical surfaces, selecting the surface radii of curvatures with specific relationships and having the reticle and the FPD substrate symmetrically arranged relative to the optical system. Specifically, the radius of curvature of the convex mirror is one-half of the radius of curvature of the concave mirror. (Note that it is also possible to use two convex and one concave mirrors instead of two concave and one convex, but such a design is considerably more difficult.)

Using these optical design principles results in the optical system being naturally corrected for the aberrations spherical, coma and distortion. There can be a substantial amount of astigmatism with this design form, with the amount dependent on the reticle size and the numerical aperture at which the system is operating. The ability to correct the astigmatism is extremely important because for this optical design form the astigmatism is what limits the usable slit width, which in turn determines the production rate for the FPD substrates. Astigmatism can be corrected to a limited extent by small deviations of the surfaces from concentricity, or by a small change in the convex mirror radius of curvature.

While this design form is capable of meeting the optical performance requirements for printing 32 inch FPDs, the image quality and distortion is marginal at best when compared to the particular resolution and overlay requirements typically needed for a 42 inch display. Because of the large increase in astigmatism when imaging a 42 inch display, the usable slit width is unacceptably small from the product production rate perspective, which will be discussed in the following sections. Also, scaling the 32 inch design to print 42 inch FPD results in one of the mirrors in the optical system being a minimum of 1.2 meters in diameter. This size mirror presents optical manufacturing challenges and very difficult packaging problems both from it's physical size perspective and its approximately 700 kg weight. Also, with this size and weight optic, problems with mounting, alignment, and gravity-induced distortions are generally encountered. In comparison, the largest mirror in the tool used to manufacture 32-inch FPD is about 800 mm in diameter and weighs on the order of 200 kg.

In the two-mirror approach of FIG. 1A, an arcuate-shaped region on the reticle is formed on the FPD substrate, as illustrated in FIG. 1B. In FIG. 1B, A is a sable slit width. Optical performance is acceptable at any point within the slit width A. B is the center of slit. Optical performance gets worse on either side of the center line B. The rate of performance falloff generally increases exponentially with increased distance from the slit center line B. C is the slit height. An FPD has a diagonal dimension from 42 to 60 inches. Aspect ratio (length to width) is generally the industry standard of 16:9. A larger FPD diagonal dimension results in an increased slit height. Slit heights range for 550 mm for a 42 inch diagonal to 775 mm for a 60 inch diagonal. In operation the slit is scanned from left to right (or vice-versa) to print the FPD circuit pattern. At any point in time only the area defined by the slit is being exposed on the FPD.

To image the full circuit pattern of the FPD substrate, the arcuate-shaped field of view is scanned across the full width of the reticle. This creates an image of the circuit pattern on the photoresist coated substrate. The height of the arcuate shape is designed to be the same as the vertical axis of the FPD screen, which for a 42-inch screen is about 525 mm. This enables a circuit pattern to be imaged on the substrate in a single scan. For a 42 inch FPD the screen width is about 930 mm.

The width of the arcuate surface depends on the residual aberrations of the optimized optical design. To achieve a high production rate, a large slit width is desired. Larger slit widths result in more photons reaching the photoresist per unit time. A greater number of photons per unit time enables a shorter exposure time when printing the circuit pattern, thus enabling more FPD substrates to be printed per hour. Based on the typical power level in a FPD tool source system, an arcuate width of at least 5 mm is desired.

It is important to note that as the FPD size increases, the residual aberrations increase in any 1× optical system. Not only does the magnitude of the residual aberrations increase with FPD size, but aberrations which could be previously ignored because of their small size now reach a magnitude where they must be considered in the optical design optimization process. The aberration increase is not linear with FPD size. The aberrations of concern increase with square, fourth and sixth power of the FPD size.

In order to meet the image quality and distortion requirements necessary to print FPD circuit patterns, these aberrations must be reduced in magnitude to an acceptable level. Adjusting the various parameters, such as the optical surface curvatures, surface shape, optical element spacing, aperture stop location, etc. can control the magnitude of the aberrations. For those familiar in the art of optical design, it is a well known principle that the number of different aberrations that can be corrected is directly related to the number of parameters, or degrees of freedom, that are available for adjustment. For example, six degrees of freedom enable six aberrations to be corrected ("corrected" means that the magnitude of an aberration can be improved). However, these same degrees of freedom are needed to control other aspects of the optical design, such as the first order design characteristics magnification, focal length, back working distance, etc. As a result, after accounting for the degrees of freedom needed to control the first order design characteristics, only one or two of the degrees of freedom out of the original six may be available to correct aberrations. Unfortunately, some of the optical design variables that are considered "degrees of freedom" have very little impact on the relative magnitude of the aberrations. While an optical system may have six degrees of freedom, only four of those variables may impact the aberrations' magnitudes in a meaningful way. Because of this the number of degrees of freedom is therefore an important factor in an optical design form. From the aberration correction perspective, an optical design form that has many degrees of freedom will enable superior optical performance to be achieved as compared to a design form that only has a few degrees of freedom.

In designing the conventional two-mirror system described in U.S. Pat. No. 3,748,015, there are only 9 degrees of freedom: spacing between object plane and concave mirror 101; radii of curvatures of concave mirror 101 and convex mirror 102; x and y tilt of concave mirror 101; concave mirror 101 to convex mirror 102 distance; x and y tilt of convex mirror 102; and concave mirror 101 to image plane distance. (For spherical mirrors, a lateral displacement, or decenter, is the equivalent to tilting the surface.) During the optical design process, six of these degrees of freedom are needed to control numerical aperture, magnification, focal length and alignment related errors. This leaves three variables, which is insufficient to control all the aberrations plus any other optical performance considerations, such as telecentricity.

Accordingly, for the manufacture of large-scale FPD's, it is desirable to have an optical design form that enables relatively small optics to be used in the design and to have sufficient degrees of freedom available to correct all the critical aberrations and related optical performance considerations.

SUMMARY OF THE INVENTION

The present invention is directed to a large field of view projection optical system with magnification and aberration correctability for large flat panel display manufacturing that substantially obviates one or more of the problems and disadvantages of the related art.

Accordingly, there is provided an exposure system for manufacturing flat panel displays (FPDs) including a reticle stage adapted to support a reticle. A substrate stage is adapted to support a substrate. A reflective optical system is adapted to image the reticle onto the substrate. The reflective optical system includes a primary mirror divided into a first mirror and a second mirror, and a secondary mirror. The reflective optical system has sufficient degrees of freedom for both alignment and correction of third order aberrations when projecting an image of the reticle onto the substrate by reflections off the first mirror, the secondary mirror, and the second mirror.

In another aspect there is provided an exposure system for manufacturing FPDs including a substrate stage adapted to support an FPD substrate. A reflective optical system adapted to image a reticle onto the FPD substrate includes only a first mirror, a second mirror, and a secondary mirror as its curved reflective elements. The reflective optical system has at least 14 degrees of freedom.

In another aspect there is provided a unit magnification ringfield optical system for FPD manufacturing including a mask having the FPD circuit pattern. A projection optical system for projection of an image of the mask onto a substrate includes a first concave mirror and a second concave mirror, and a convex mirror. The concave mirrors have their centers of curvature substantially coincident with the concave mirror, and are substantially symmetrically positioned with respect to a center of the convex mirror. A radius of curvature of the convex mirror is one-half of radii of curvature of the concave mirror. In these design forms, the mirrors are aspherical with centers of curvatures of the mirrors being substantially coincident and the convex mirror radius of curvature is nominally one half that of the concave mirror. This reflective optical system form has 10 more degrees of freedom then the previously described two aspheric mirror design form. These extra degrees of freedom are used to improve the projection optics performance as compared to a two spherical mirror design in U.S. Pat. No. 3,748,015. The extra degrees of freedom available due to splitting the single concave mirror in to two mirrors is very important when adjustments to object and/or image plane location and magnification are required when using the optical system. Any adjustment to the object and/or image and magnification will also result in unwanted aberrations being introduced. These aberrations can be corrected for by using one or more of the extra degrees of freedom available by splitting the concave mirror.

In another aspect there is provided unit magnification ringfield optical system for FPD manufacturing including a mask having a circuit pattern for the FPD. A projection optical system for projection of an image of the mask onto a substrate includes a first convex mirror, a second convex mirror and a concave mirror. The first and second convex mirrors have their centers of curvature substantially coincident with a center of curvature of the concave mirror. The first and second convex mirrors are substantially symmetrically positioned with respect to a center axis of the concave mirror. A radius of curvature of the concave mirror is one-half of radii of curvature of the convex mirrors.

In another aspect there is provided an exposure system for manufacturing FPDs including a source of electromagnetic radiation, a reticle mounted on a reticle stage, and a reflective optical system adapted to image the reticle onto a substrate that is mounted on a substrate stage. The reflective optical system includes only three powered reflective surfaces, including a first mirror and a second mirror, and a secondary mirror. The reflective optical system has sufficient degrees of freedom for both alignment and correction of third order aberrations.

Additional features and advantages of the invention will be set forth in the description that follows. The advantages of the invention will be realized and attained by the structure particularly pointed out in the written description.

It is to be understood that both the foregoing general description and the following detailed description are exemplary and explanatory and are intended to provide further explanation of the invention.

DETAILED DESCRIPTION OF THE INVENTION

Figure 1A:
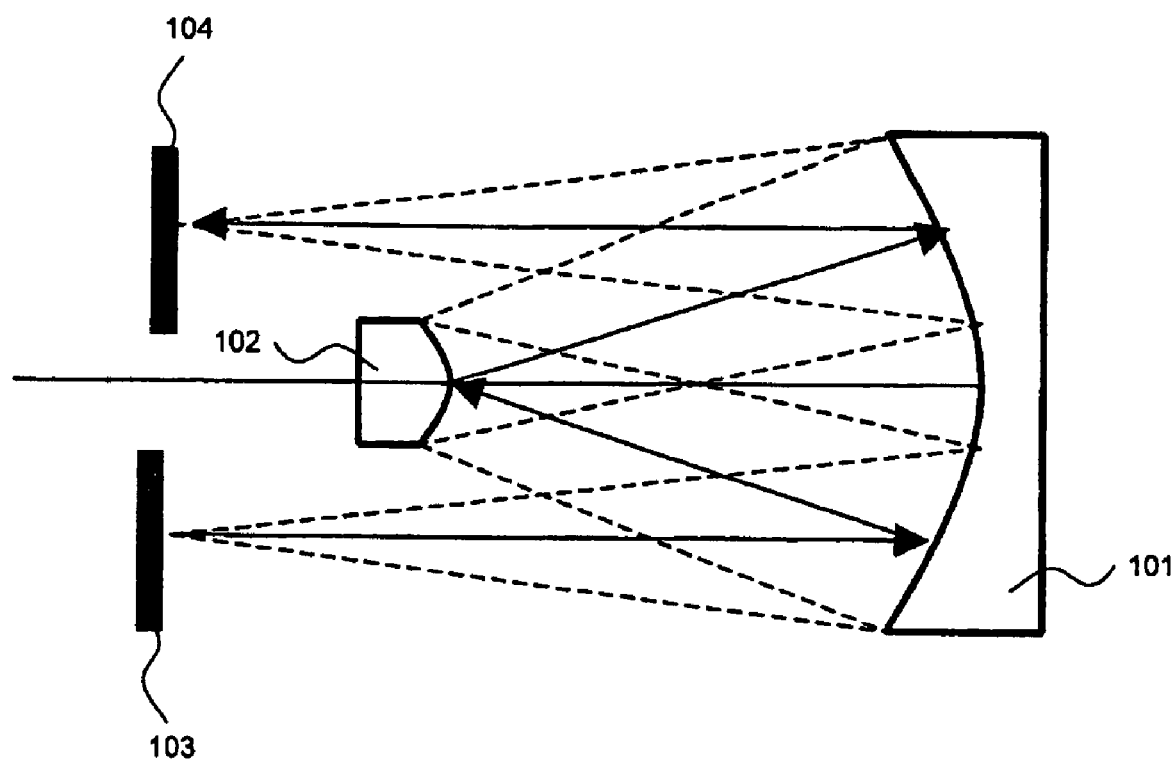
FIG. 1A shows a conventional two-mirror projection optical system used in the FPD manufacture.

Reference will now be made in detail to the embodiments of the present invention, examples of which are illustrated in the accompanying drawings. Wherever possible, the same reference numeral is used to designate the same element in different figures.

Figure 1B:
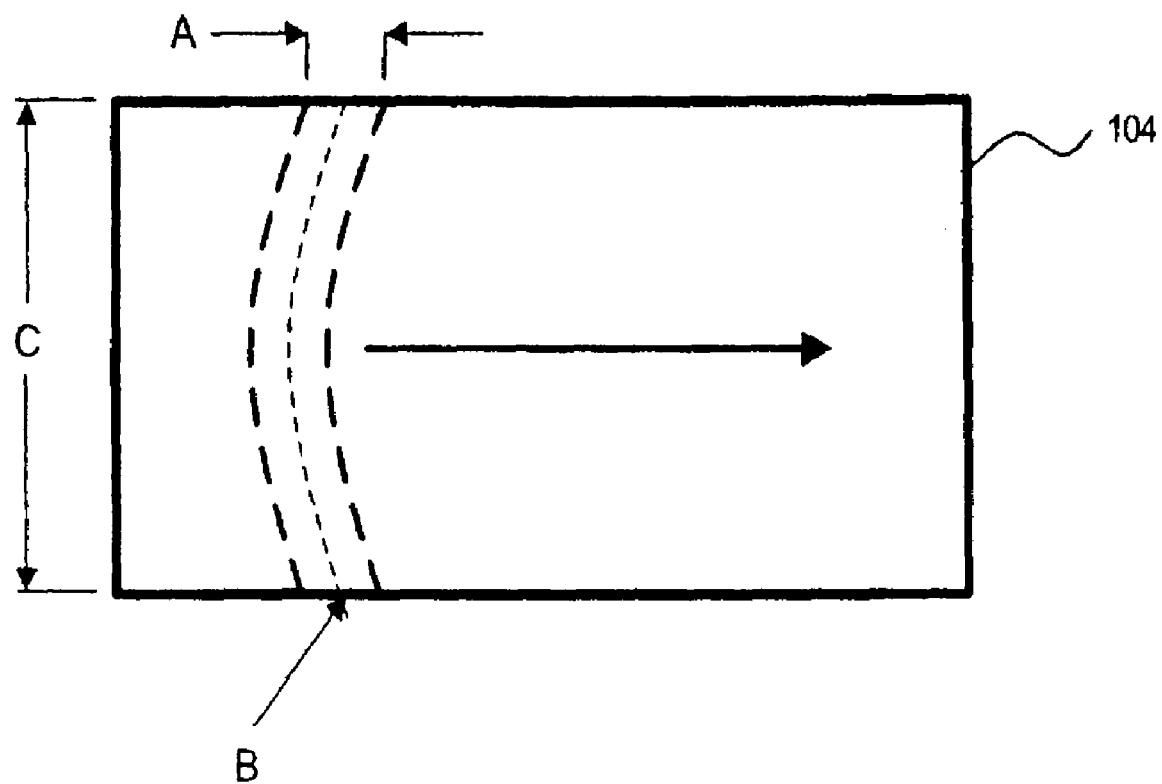
FIG. 1B shows an arcuate-shaped region on the reticle formed on the FPD substrate.
Figure 2:
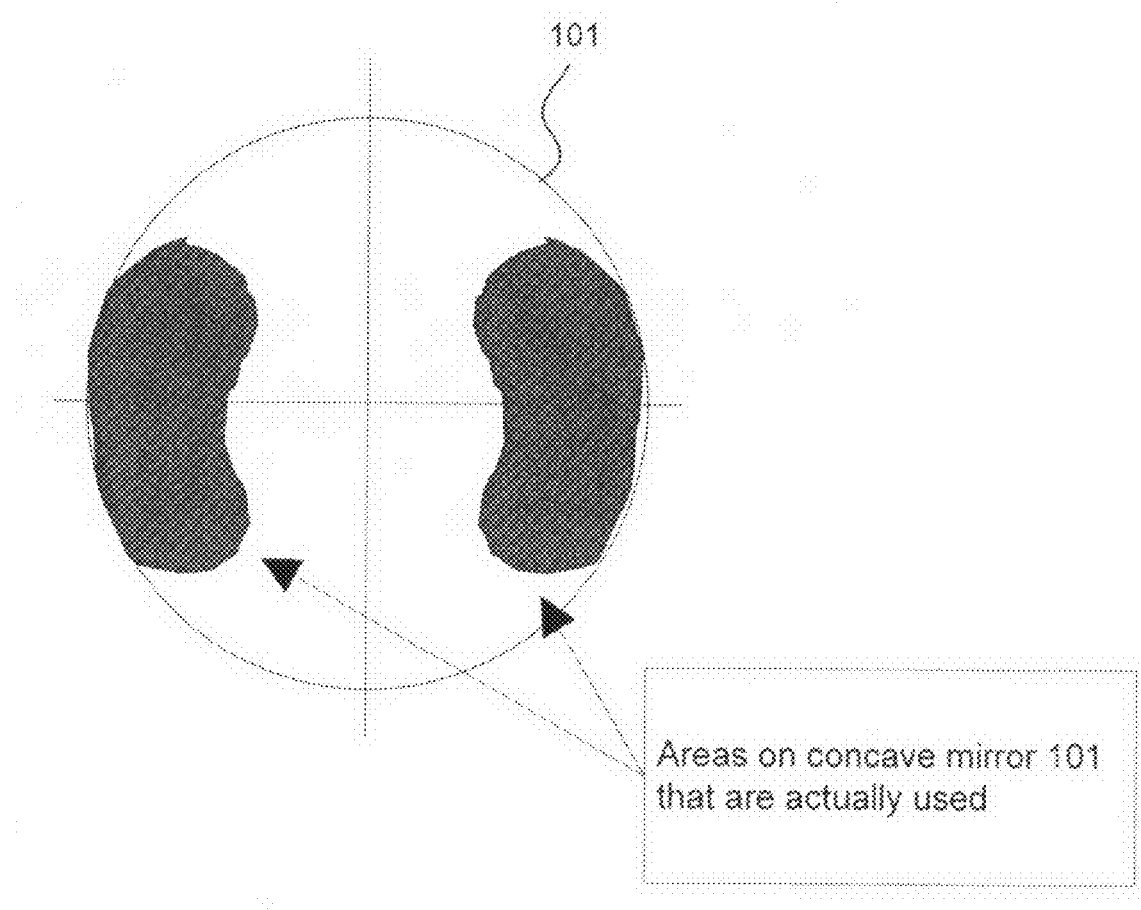
FIG. 2 shows the arcuate shaped slit shape characteristic of the annular field optical design form in FIG. 1.

FIG. 2 illustrates how, in the conventional two-mirror projection system of FIG. 1, only a small portion of the primary mirror 101 is actually used. The fact that only a small portion of the mirror 101 is used provides the rationale for splitting the mirror 101 into two separate mirrors, which are smaller than the single primary mirror would otherwise need to be. In the present invention, with the primary mirror being split in two, it is possible to adjust the properties of the image without affecting the properties of the object.

A new optical design form for a 1× lithography tool is described that has significant benefits over current optical systems, especially those used in printing flat panel displays (FPDs) that are 42 inches diagonal in size and larger, for example, 54 or 60 inches diagonal. The new design form has benefits in size, weight, optical manufacturability, mechanical mounting, optical system alignment, compensating adjustment options, packaging and cost over conventional designs.

The new optical design form employs aspheric optical surfaces. The aspheric surfaces enable superior resolution, optical distortion and telecentricity as compared to the prior art spherical surface optical design forms. The new design uses three mirrors—two concave and one convex—that are aligned to each other so their centers of curvature are nominally coincident. The reticle and substrate are nominally positioned along a plane perpendicular to the optical axis at the location of the mirrors' centers of curvature. By making the centers of curvatures of the mirrors substantially coincident, the three mirror design is corrected over an annular field of view for all the third order aberrations with the exception of astigmatism, which is only corrected at one location in the annular field. Third order astigmatism over the desired annular field, higher order aberrations and telecentricity can be corrected using the added degrees of freedom that are available when using aspheric surfaces. A commercial optical design program such as Code 5™ or Zemax™ can be used to easily calculate by someone familiar in the art the aspheric terms to correct the aberrations to an acceptable level.

While only one set of aspheric terms for the mirrors will result in the best optical performance, there are many combinations of aspheric terms that will result in acceptable optical performance.

The individual mirror radii of curvatures, the spacing between mirrors and concentric center of curvature condition can be also be adjusted during the optical design process for calculating the aspheric terms. Adding these degrees of freedom will reduce the number of aspheric terms required to achieve the required optical performance. Reducing the number of aspheric terms will result in more optical manufacturing companies being able to fabricate the mirrors and lower mirror costs.

The optical design process is repeated adding the design variables available with this element. While it is possible to achieve superior performance by adding correctors to a design optimized using just the three mirror, this system will not achieve as good a performance as a design optimized using all the degrees of freedom available simultaneously has important benefits.

Adjustments of 1-2 mm or so in the relative positions of the centers of curvature are possible, to correct for aberrations. The concave mirrors are symmetrically positioned with respect to the center axis of the convex mirror, although adjustments of 1-2 mm or so are possible here as well, to correct for additional aberrations.

In addition, by slightly changing the radius of curvature of one of the concave mirrors, the fifth order astigmatism can be corrected, while still having a system with a level of Petzval curvature that enables the resolution requirement to be achieved across the desired field of view.

The new optical design forms have at least 10 extra degrees of freedom, as compared to the conventional design form, for full field scanning. The extra degrees of freedom can be used to compensate for other errors in the system, such as coating errors, gravity induced distortion of the optics, optic mount-induced distortion, etc. If desired, the extra degrees of freedom can also be used to relax some optical specifications for components in the optical system.

Although an asphere can take the shape of any surface that can be mathematically described, an even or odd high order polynomial is typically used. The following equation is an example of an even high order polynomial used to describe an asphere:

$$z = \frac{Cy^2}{1 + [1 - (1+K)C^2y^2]} + Ay^4 + By^6 + Cy^8 + Dy^{10}$$

Where z is the departure of the aspheric surface from the base spherical surface sagittal; C is the reciprocal of the spherical surface radius of curvature; y is the location on the surface; K is an aspheric departure term, usually referred to as a conic constant; A, B, C, D are generally referred to as the coefficients of each high order term for the polynomial.

The equation above is an example of an "even" high order polynomial. In addition to the mirror surfaces radii of curvature being a design variable degree of freedom during the optical design process, each surface described by an even order polynomial can have the added degrees of freedom K, A, B, C, D, etc. As a result of having these extra degrees of freedom more aberration can be corrected then in the 1× optical design form described in U.S. Pat. No. 3,748,015.

The number of aspheric terms used in the design is dependent on the acceptable optical design residual. The conic constant K, and four higher order aspheric coefficients, A, B, C and D, result in acceptable performance for projection optics used to print 42-inch FPD circuits along with the desired object and image locations, magnification and arcuate slit width.

Because the two concave mirrors can be moved independently it is possible to make system magnification adjustments which are not possible in the prior art.

In this design form the centers of curvatures of the concave and convex mirrors are substantially coincident and the convex mirror radius of curvature is nominally one half that of the concave mirror. In addition to the radii of curvature of each mirror being a variable, as in the two-mirror design of U.S. Pat. No. 3,748,015, in the projection optics optical design, an aspheric component is added to the concave mirror. Different forms and types of asphericity can be added to each surface. Each aspheric term added to each reflective surface is another optical design variable. As a result, it is possible to reasonably add 5 additional variables to the concave surface in the optical design process. The number of aspheric terms used in the design is dependent on the acceptable optical design residual. The conic constant and four higher order aspheric coefficients result in acceptable performance for a projection optical system used to print 42 inch FPD circuits. The combination of the mirror radii of curvatures, aspheric surface, spacings and tilts enable the desired object and image locations, magnification and correction of aberrations to an acceptable level.

Conventionally, 32-inch FPDs are printed using lithography tools with an 800 mm diameter spherical mirror. The new optical design form allows 42-inch FPDs to be printed with an 800 mm diameter mirror.

The new baseline design has the same optical performance as the two-mirror design currently in use for making 32-inch displays, but with significantly smaller mirrors. Mirror size is a critical issue in lithography tools for printing 42 inch FPDs. A two-mirror design requires one of the mirrors in the system to be >1.1 meter, while the three mirror design of the present invention has a maximum mirror size of about 750 mm (and scaling roughly linearly for 54 and 60 inch diagonal FPDs).

Accordingly, a nominally 1× lithographic exposure system for manufacturing flat panel displays (FPDs) includes a reticle stage adapted to support a reticle. A substrate stage holds a substrate on which an FPD circuit pattern will be printed. A reflective optical system with a large number of degrees of freedom images the reticle onto the substrate. The reflective optical system includes a concave primary mirror, a convex secondary mirror and concave tertiary mirror with one or more of these mirrors having aspheric surfaces.

Figure 3:
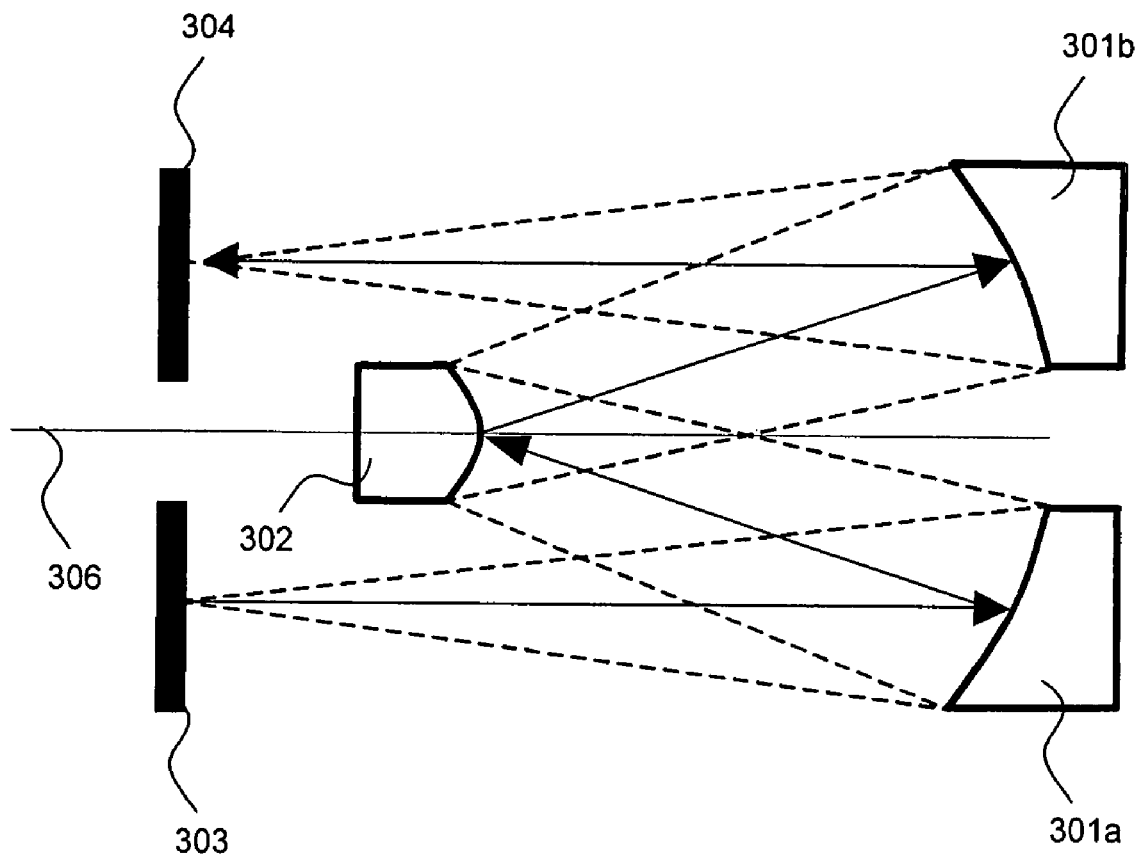
FIG. 3 shows a projection optical system of the present invention.

In the baseline design form, the two concave mirrors have radii of curvatures and aspheric profiles that are nominally identical, the convex mirror radius of curvature is nominally one half that of the concave mirrors and the centers of curvatures of all the mirrors are substantially coincident. FIG. 3 illustrates this optical design form. The exact radii of curvature and type of aspheric surface on the mirror surfaces depends on the FPD reticle size and optical performance required over the operating slit width. The benefit of adding aspheric surfaces to the optical design is the increase in the number of degrees of freedom available during the optical design process.

The invention works by splitting into two mirrors what would be a single concave mirror in the conventional optical design. FIG. 3 shows how this can be accomplished and results in smaller mirrors then in the conventional design. By splitting one large concave spherical mirror in the design into two mirrors 301a, 301b, the sizes of the mirrors 301a, 301b in the optical design are significantly reduced. Splitting one optical surface into two and reducing the size of the elements has optical manufacturing benefits, lithography tool size benefits, and offers increased flexibility in correcting optical system alignment errors.

As may be seen in FIG. 3, the projection optical system of the present invention includes the primary concave mirror 301a, a secondary (convex) mirror 302 and the tertiary concave mirror 301b. A reticle 303 is positioned off axis (i.e., off axis 306). An image of the reticle 303 is projected onto a substrate 304.

In the system shown in FIG. 3, the concave mirrors 301a, 301b are aspherical, and are symmetrically positioned with respect to the center of the secondary mirror 302. The concave mirrors 301a, 301b typically have the same radius of curvature (although this need not always be the case). The radius of curvature of the secondary mirror 302 is about one-half of the radius of curvature of the concave mirrors 301a, 301b.

The configuration of FIG. 3 allows the use of smaller mirrors than in equivalent unit magnification systems, so that the two mirrors 301a, 301b replace a single large concave mirror. The centers of curvatures of the concave mirrors 301a, 301b may be displaced, so as to compensate for the aberrations that result from any magnification adjustments, from residual optical manufacturing errors, from coating errors, or from mount-induced errors. In other words, the availability of additional degrees of freedom can be taken advantage of to compensate for additional aberrations.

In addition to the design configuration based on the aspheric equation above having superior optical performance than the design form in FIG. 1A, the design form in FIG. 3 has the added advantage that both concave mirrors are smaller in size and weight then the concave mirror in FIG. 1A. The benefits of the smaller size mirror include reduced optical fabrication costs, less unwanted gravity induced distortion to the mirror surface shape and easier mounting in the lithographic tool.

Figure 4:
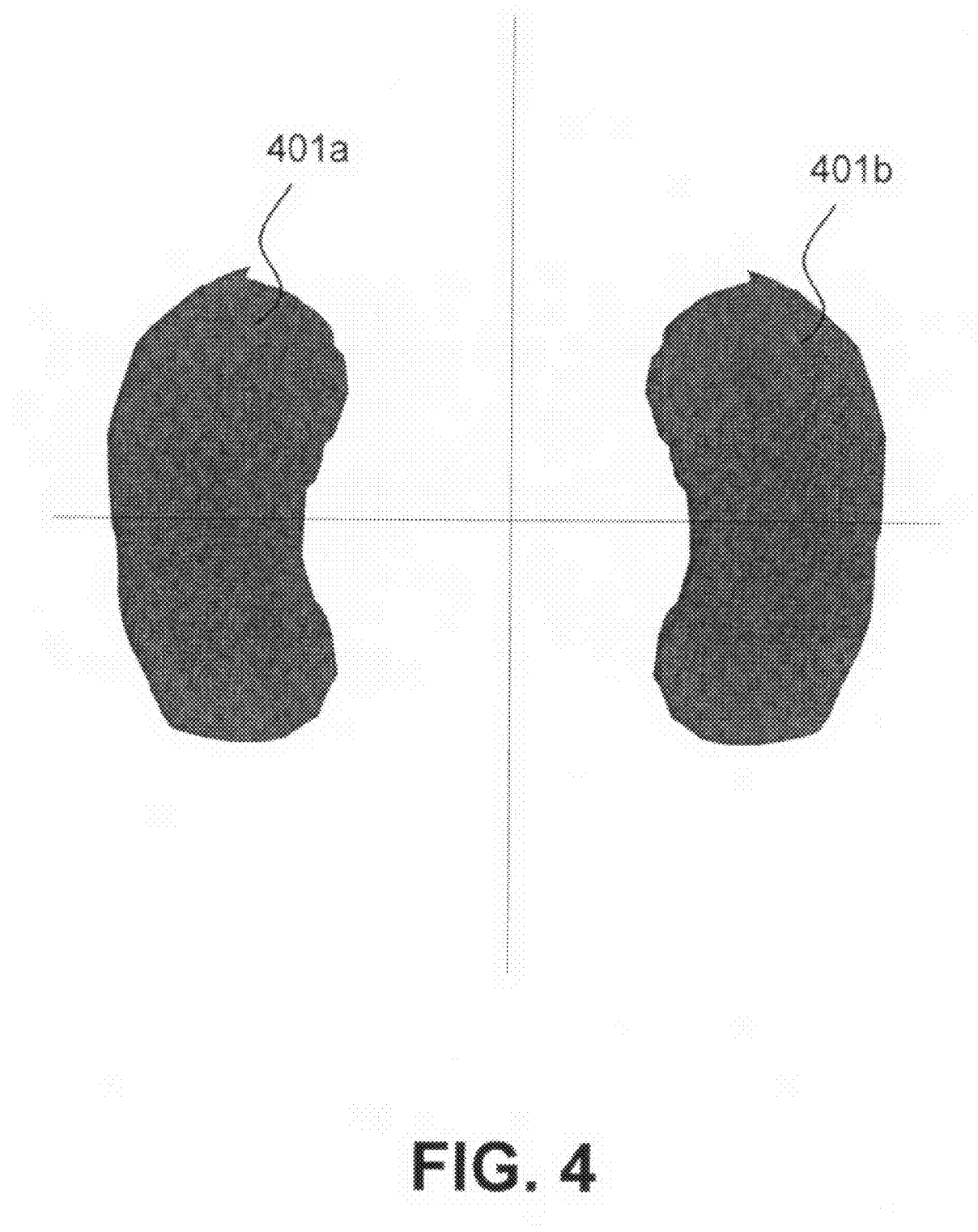
FIG. 4 shows the actual area used on concave mirror.

FIG. 4 shows the actual area used on concave mirror and illustrates why the two concave mirrors 301a, 301b, can replace the single concave mirror.

For each degree of freedom, an aberration can be corrected. Note that increasing the number of mirrors or the number of aspherical terms used to describe an aspheric surface in the design is directly related to the number of degrees of freedom available during the optical design and alignment.

Also, the aspherization of the mirrors 301a, 301b, need not be identical. The convex mirror 302, when it is polished, has a certain degree of astigmatism. It is possible to shape the concave mirrors 301a, 301b so as to introduce the opposite amount of astigmatism, canceling the overall astigmatism out. Alternatively, only one of the concave mirrors 301a, 301b may be purposely mis-aligned, so as to cancel out the astigmatism due to the fabrication errors. The use of the three-mirror design of FIG. 3 also allows correcting for gravity-induced distortions, which is difficult to do with a two-mirror design.

In addition to the mirrors 301a, 301b, the secondary mirror 302 may also be aspheric.

From an optical manufacturing perspective, the smaller mirrors 301a, 301b have several important advantages over the single large mirror design of FIG. 1A:

Substrate price is impacted by both the total volume and by the size of the substrate (due to handling, equipment and fabrication time);

Generating, grinding and polishing time is less because there is less total surface area with the smaller substrates; and The size and weight of the mirrors is compatible with standard commercial optical manufacturing equipment.

In the lithography tool, the reduced mirror size and rectangular shape results in easier mounting, less gravity induced distortion, and less demanding adjustment mechanisms.

An additional benefit obtained by splitting the concave mirror into two mirrors 301a, 301b and having aspheric surfaces includes being able to adjust spacings between the three mirrors, which can change the focal length of the system. In a two-mirror design, adjusting the focal length introduces spherical aberration. However, in the three-mirror design, by adjusting the two mirror spacings, most of the spherical aberrations can be removed after a focal length change has been made.

If the optical coating process introduces spherical aberration and/or astigmatism, re-spacing and tilting the mirror 301a or 301b will correct these errors.

If the thermal load on any of the mirrors causes a mirror surface to distort with a low order aberration, spacing and/or tilt changes can correct the error.

Magnification in a two-mirror system is adjusted by changing the reticle distance. However, this introduces aberrations. Re-spacing the mirrors correct most of the wavefront aberrations.

Mirror mount induced surface figure errors can be mostly corrected if they are a low order aberration.

Optical manufacturing errors that result in the wrong radii of curvatures for the mirrors can be mostly compensated for by spacing changes between the three mirrors.

If it is determined a refractive or reflective corrector is needed because of a requirement for a large slit width, and then the commercial optical design program can be used to calculate the optical prescription, as would be apparent to one of ordinary skill in the art. Again, there are many combinations of radii of curvatures and aspheric coefficients for the correctors that will result in acceptable optical performance. Thus, refractive corrector lenses may be added between either or both the mask and primary mirror and/or the tertiary mirror and photoresist coated substrate. These correctors result in better image quality and distortion and wider operating slit as compared to the two aspheric mirror design, as would be apparent to one of ordinary skill in the art.

The correctors can be designed to be located at any distance between the reticle and primary mirror or tertiary mirror and substrate provided they do not cause vignetting (a gradual fading of the image towards the edges of the image). However, the best locations for the correctors are as close to the reticle and substrate that is practical considering mechanical packaging of the optical system. In the baseline design form, the two concave mirrors have radii of curvatures and aspheric profiles that are nominally identical, the convex mirror radius of curvature is nominally one half that of the concave mirrors and the centers of curvatures of all the mirrors are substantially coincident. The refractive corrector lenses can take the form of flat and parallel surfaces, one surface flat with the other having an aspheric profile added to the flat surface, both with aspheric surfaces, meniscus lens, meniscus lens with aspheric surfaces on either or both surfaces. The corrector elements on the reticle and substrate sides have nominally the same optical design prescription. The exact optical prescription for the corrector element depends on the reticle size, operating wavelength and the optical resolution and distortion requirements.

Figure 5:
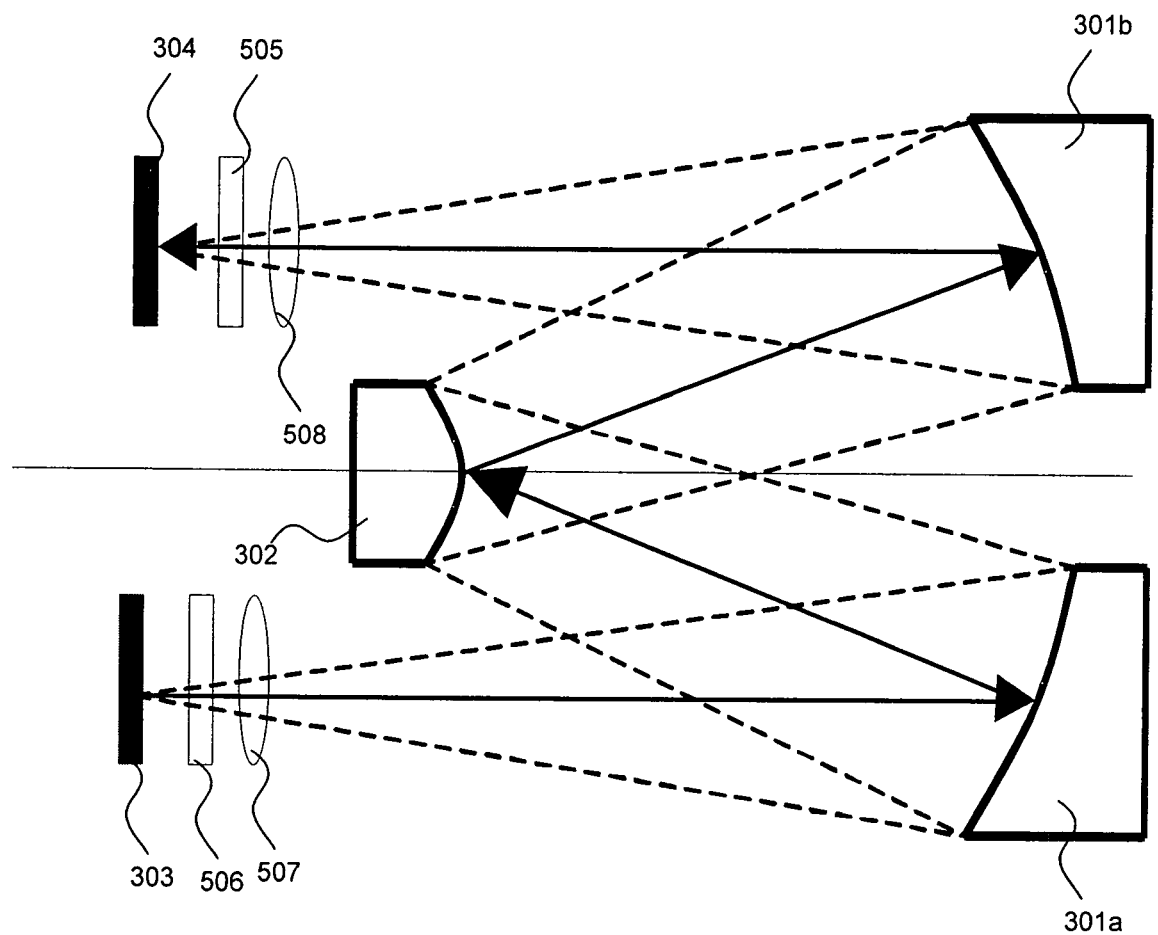
FIG. 5 illustrates the reduced size of the mirrors in the new optical design form.

FIG. 5 illustrates a modification of the system of FIG. 3. As may be seen in FIG. 5, relatively thin, flat glass plates 505, 506 may be added, either near the reticle 303, or near the substrate 304, or both. The thickness of the glass plates 505, 506 is typically on the order of 5-10 mm for a 42-inch FPD manufacturing system (roughly scaling linearly with FPD size). The glass plates 505, 506 may be used to compensate for various aberrations in the optical system, as would be apparent to one skilled in the art. The thickness of the glass plates 505, 506 depends on overall system design, and the magnitude and type of aberrations that need to be corrected.

Additionally, a meniscus lens 508 or 507 may be used to further correct the aberrations, as shown in FIG. 5. One or both meniscus lenses 508, 507 may be used (and may also be used together with the glass plates 505, 506). The meniscus lenses 508, 507 are roughly on the order of 1-2 cm in thickness for a 42-inch FPD manufacturing system (i.e., a diameter of about 525 mm).

Reflective corrector mirrors also may be added between either or both the mask and primary mirror and/or the tertiary mirror and photoresist coated substrate. The correctors can be designed to be located at any distance between the reticle and primary mirror or tertiary mirror and substrate, provided they do not cause vignetting. However, the best locations for the correctors are as close to the reticle and substrate that is practical considering mechanical packaging of the optical system. These correctors result in better image quality and distortion and wider operating slit as compared to the three aspheric mirror design.

Figure 6:
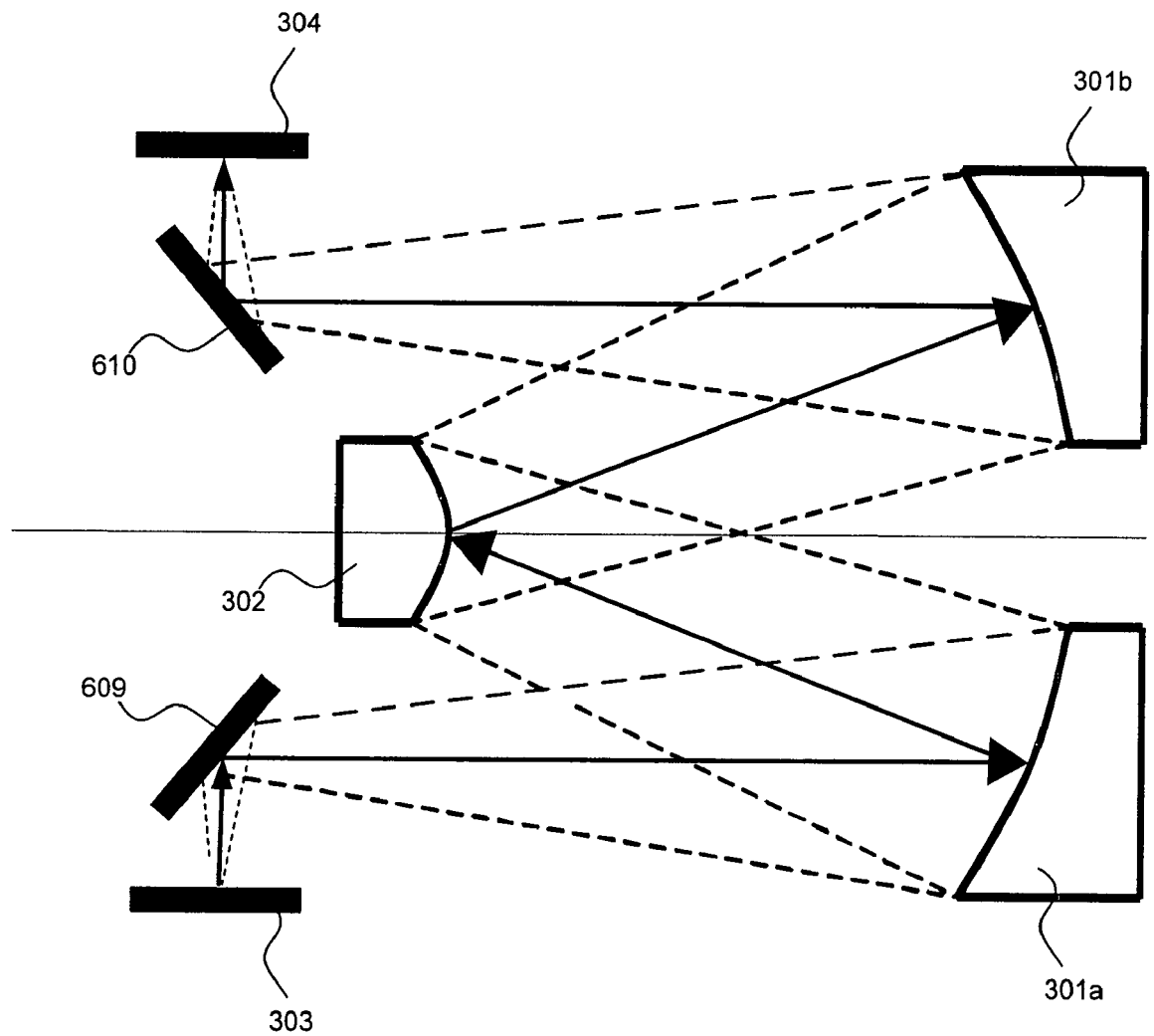
FIG. 6 shows a projection optical system of the present invention with corrector lenses.

FIG. 6 illustrates this optical design form. In the baseline design form the two concave mirrors have radii of curvatures and aspheric profiles that are nominally identical, the convex mirror radius of curvature is nominally one half that of the concave mirrors and the centers of curvatures of all the mirrors are substantially coincident. The reflective correctors have flat surface on which the desired aspheric prescription is added. The corrector elements on the reticle and substrate sides have nominally the same optical design prescription. The exact optical prescription for the corrector element depends on the reticle size, operating wavelength and the optical resolution and distortion requirements.

As shown in FIG. 6, nominally flat mirrors 610, 609 may be used as reflective correctors. The mirrors 609, 610 may have asphericity, and may be oriented at an angle of 45 degrees, or some other angle, consistent with their asphericity. Either the mirror 609, or the mirror 610, or both, may be used. Alternatively, either the mirror 609, or the mirror 610, or both, may be powered mirrors.

Two examples will be used to illustrate the present invention, although it will be appreciated that an infinite number of examples can be generated, depending on how the merit function of the optical system is defined. One of ordinary skill will appreciate that the invention is not limited to the optical prescriptions below, which may be generated using a computer and known optical design software.

EXAMPLE 1

The table below gives exemplary optical prescription for Example 1:

| | | | | | | | | |
|---|---|---|---|---|---|---|---|---|
| 1x Optical Design Example #1 Optimized For Reduced Volume | | | | | | | | |
| | Radius | Distance | | Conic | Aspheric Coefficients | | | |
| Surface | (mm) | (mm) | Material | Constant | $Y^4$ | $Y^6$ | $Y^8$ | $Y^{10}$ |
| Object | ∞ | 228.3 | Air | 0.0 | 0.0 | 0.0 | 0.0 | 0.0 |
| L1 | −460.7 | 30.0 | Fused Silica | 0.0 | $2.1201 \times 10^{-9}$ | $3.8746 \times 10^{-14}$ | $-3.5049 \times 10^{-19}$ | $1.1333 \times 10^{-24}$ |
| L2 | −687.3 | 1583.3 | Air | 0.0 | 0.0 | 0.0 | 0.0 | 0.0 |
| M1 | −1186.8 | −721.8 | Reflection | −0.9452 | $-1.1717 \times 10^{-11}$ | $-2.2769 \times 10^{-19}$ | $1.7648 \times 10^{-24}$ | $-1.0603 \times 10^{-30}$ |
| M2 | 1065.0 | 721.8 | Reflection | −0.3065 | $6.6519 \times 10^{-11}$ | $1.4057 \times 10^{-21}$ | $5.6254 \times 10^{-21}$ | $-1.3690 \times 10^{-25}$ |
| M3 | −1186.8 | −1583.3 | Reflection | −0.9452 | $-1.1717 \times 10^{-11}$ | $-2.2769 \times 10^{-19}$ | $1.7648 \times 10^{-24}$ | $-1.0603 \times 10^{-30}$ |
| L3 | −687.3 | −30.0 | Fused Silica | 0.0 | 0.0 | 0.0 | 0.0 | 0.0 |
| L4 | −460.7 | −228.3 | Air | 0.0 | $2.1201 \times 10^{-9}$ | $3.8746 \times 10^{-14}$ | $-3.5049 \times 10^{-19}$ | $1.1333 \times 10^{-24}$ |
| Image | | | | | | | | |

Figure 7:
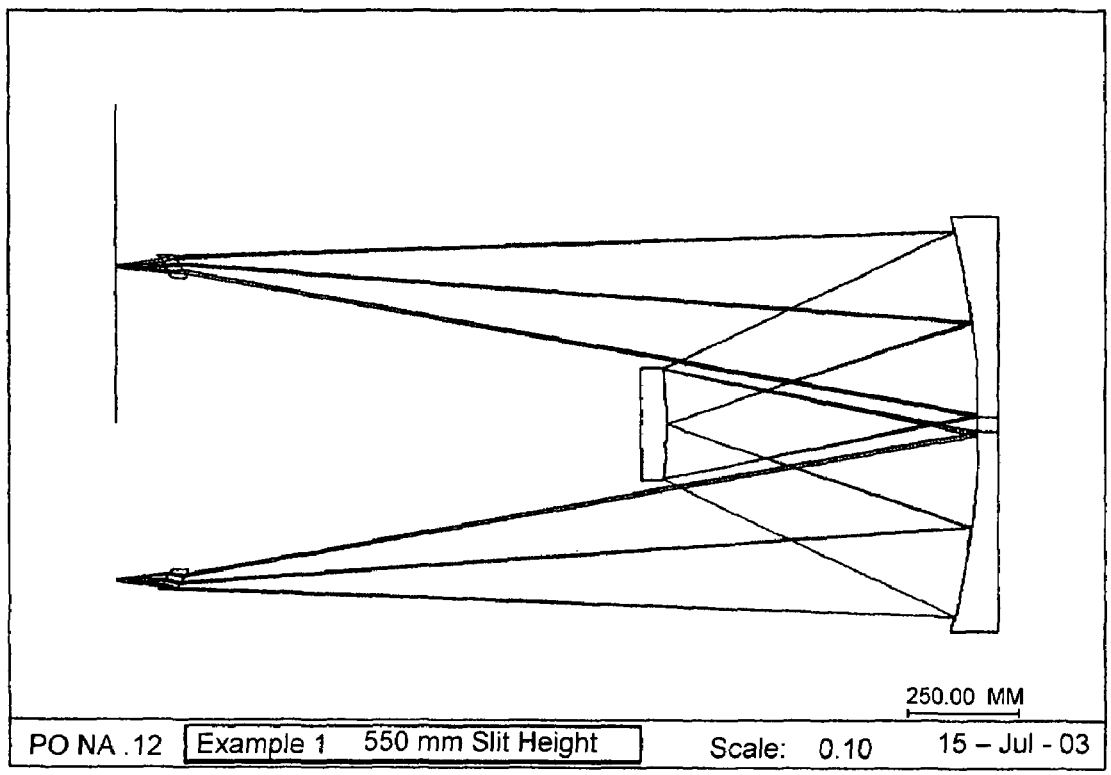
FIG. 7 shows a ray tracing diagram of one example of an optical system of the present invention.
Figure 8:
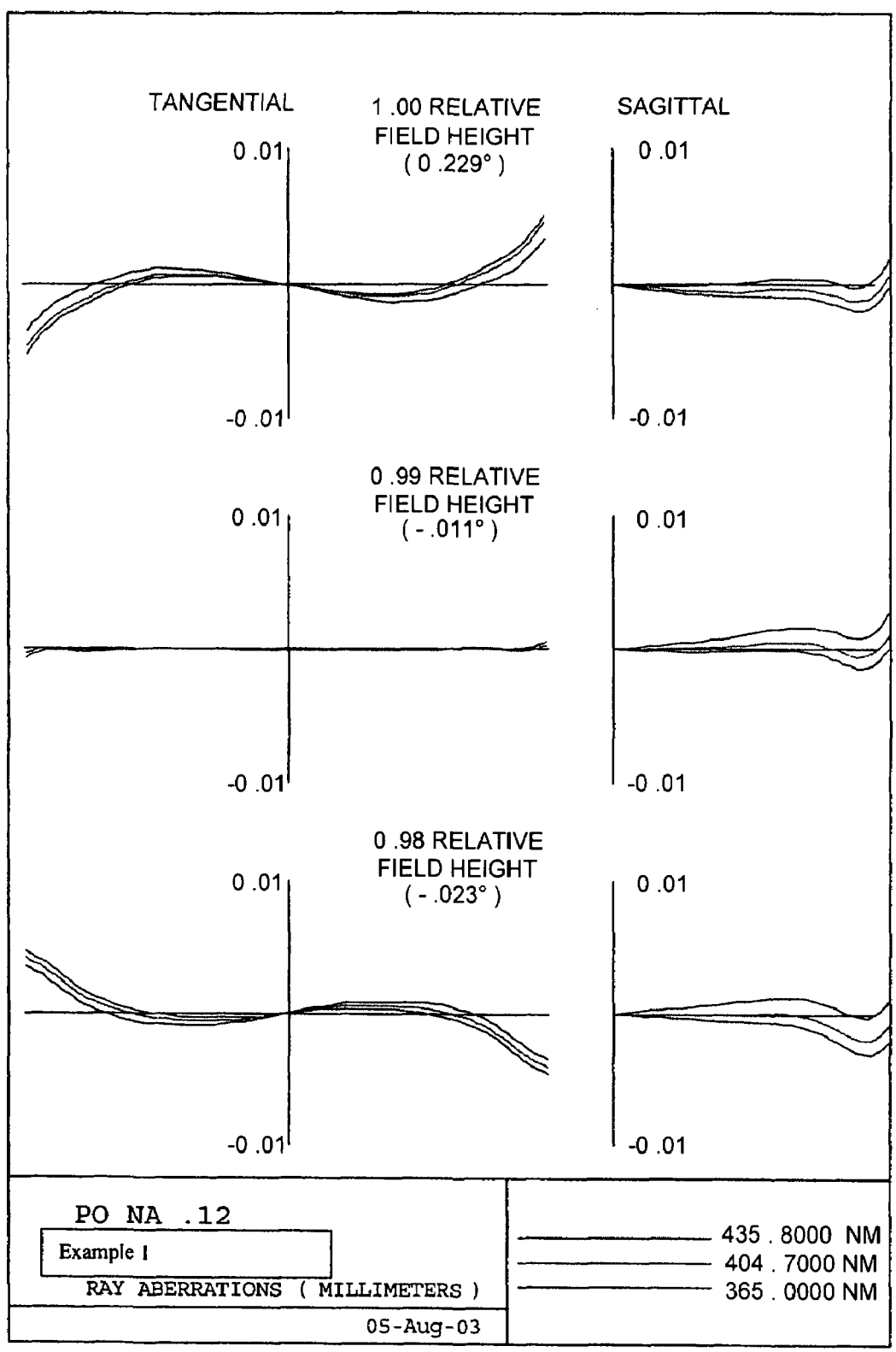
FIG. 8 shows the optical performance of the optical system of FIG. 7 in graphical form.

FIG. 7 shows a ray tracing diagram, and FIG. 8 shows the optical performance of the optical system of Example 1 in graphical form.

EXAMPLE 2

The table below gives exemplary optical prescription for Example 2 that uses refractive corrector elements:

| | | | | | | | | |
|---|---|---|---|---|---|---|---|---|
| 1x Optical Design Example #2 Optimized For Maximum Slit Width | | | | | | | | |
| | Radius | Distance | | Conic | Aspheric Coefficients | | | |
| Surface | (mm) | (mm) | Material | Constant | $Y^4$ | $Y^6$ | $Y^8$ | $Y^{10}$ |
| Object | ∞ | 420.531 | Air | 0.0 | 0.0 | 0.0 | 0.0 | 0.0 |
| L1 | −207,468.9 | 30.0 | Fused Silica | 0.0 | $1.2258 \times 10^{-9}$ | $-1.0071 \times 10^{-15}$ | $5.7191 \times 10^{-22}$ | $2.3165 \times 10^{-28}$ |
| L2 | −161,733.8 | 2,049.470 | Air | 0.0 | $1.1629 \times 10^{-9}$ | $-6.9811 \times 10^{-15}$ | $1.2524 \times 10^{-22}$ | 0.0 |
| M1 | −2,481.5 | −1,171.368 | Reflection | 0.0 | $8.4439 \times 10^{-13}$ | $-6.9104 \times 10^{-21}$ | $3.5714 \times 10^{-26}$ | 0.0 |
| M2 | 1065.0 | 1,171.368 | Reflection | 0.0 | $2.4939 \times 10^{-12}$ | $-3.0738 \times 10^{-17}$ | $1.8895 \times 10^{-21}$ | $-3.2975 \times 10^{-26}$ |
| M3 | −2,481.5 | −2,049.470 | Reflection | 0.0 | $8.4439 \times 10^{-13}$ | $-6.9104 \times 10^{-21}$ | $3.5714 \times 10^{-26}$ | 0.0 |
| L3 | −161,733.8 | −30.0 | Fused Silica | 0.0 | $1.1629 \times 10^{-9}$ | $-6.9811 \times 10^{-15}$ | $1.2524 \times 10^{-22}$ | 0.0 |
| L4 | −207,468.9 | −420.531 | Air | 0.0 | $1.2258 \times 10^{-9}$ | $-1.0071 \times 10^{-15}$ | $5.7191 \times 10^{-22}$ | $2.3165 \times 10^{-28}$ |
| Image | | | | | | | | |

Figure 9:
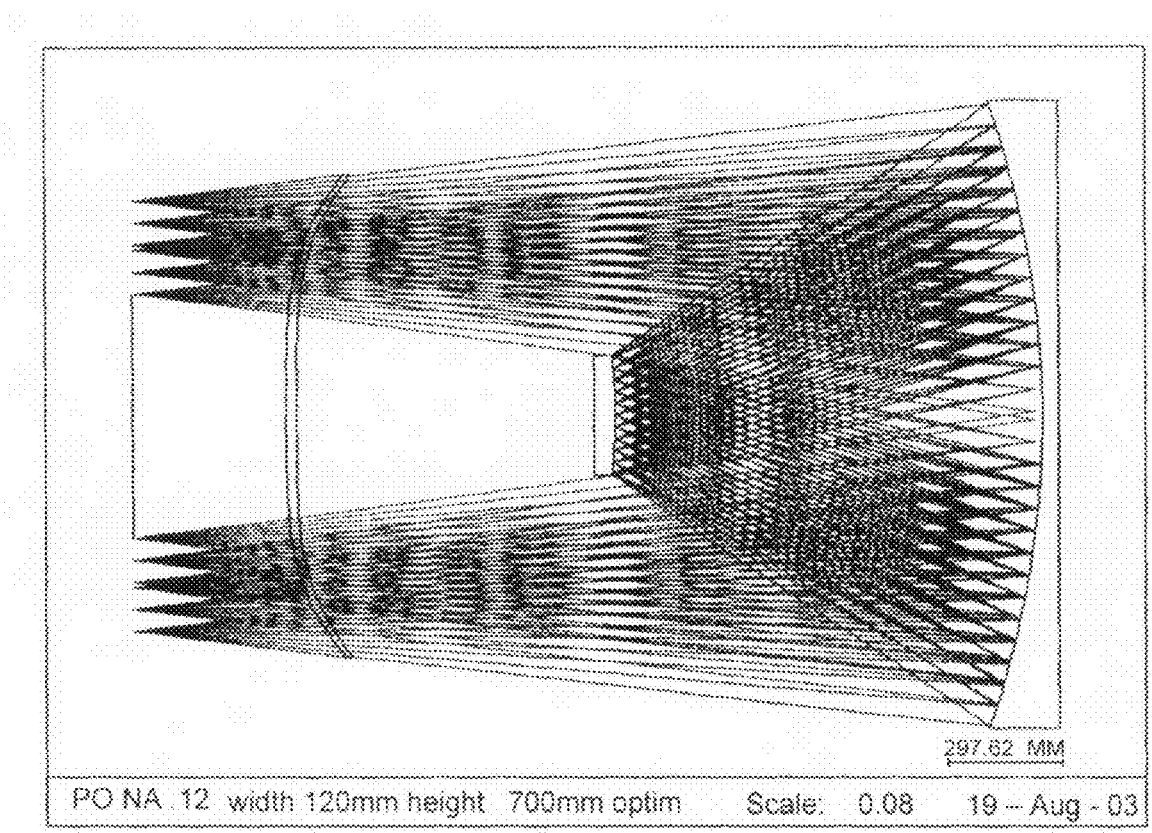
FIG. 9 shows a ray tracing diagram of one example of an optical system of the present invention.
Figure 10:
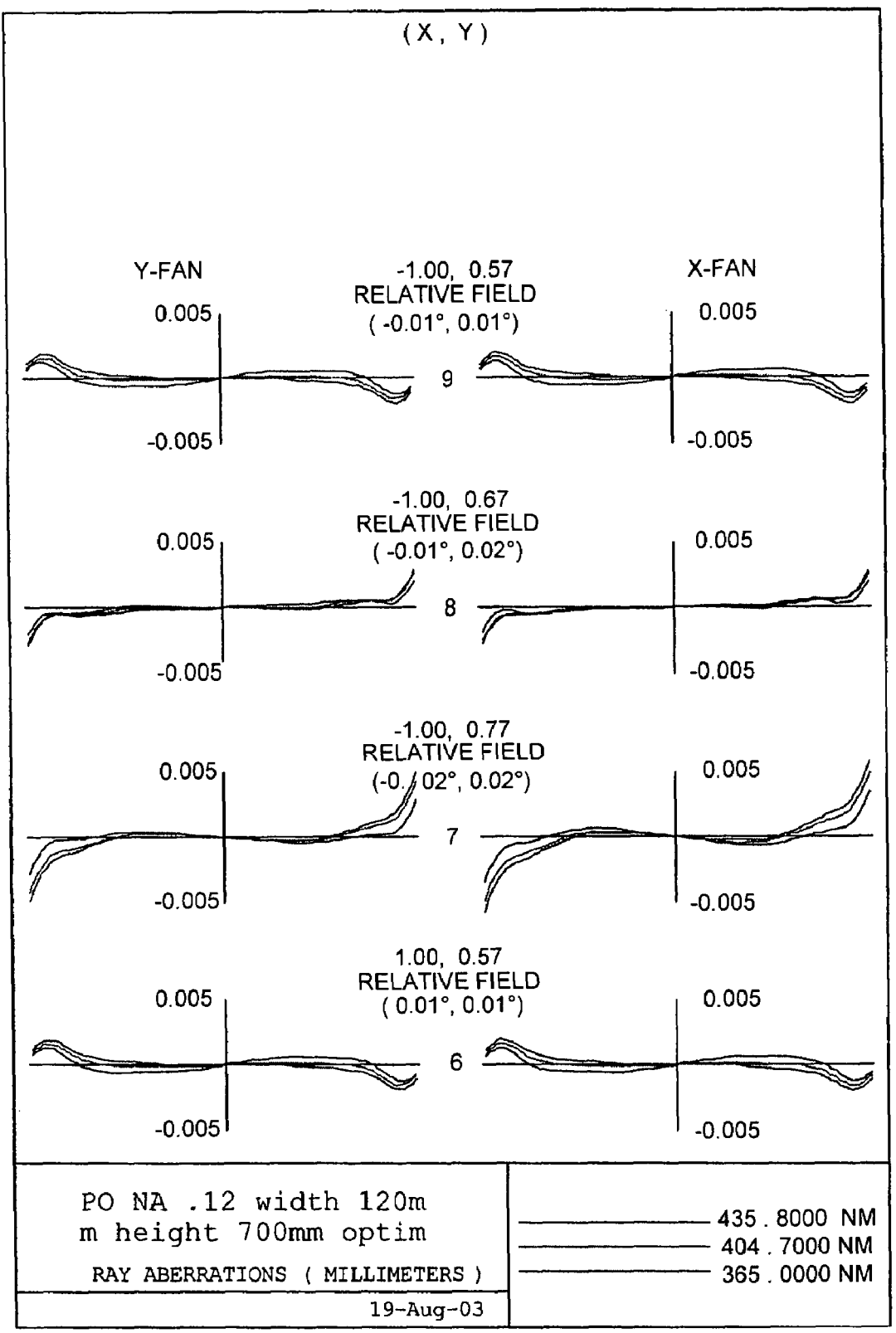
FIG. 10 shows the optical performance of the optical system of FIG. 9 in graphical form.

FIG. 9 shows a ray tracing diagram, and FIG. 10 shows the optical performance of the optical system of Example 2 in graphical form.

| Examples Of Optical Performance Achievable With Proposed 1x Optical Design Form | | | | | | |
|---|---|---|---|---|---|---|
| Design | Numerical Aperture | Usable Slit Width (mm) | Wavefront Quality (λ rms) | Distortion (μm) | Telecentricity (mrad) | Comments |
| Requirement | >0.10 | >9.0 | <0.07 | <0.6 | <0.4 | |
| Example 1 | 0.12 | 10.0 | 0.07 | 0.01 | 0.2 | Design optimized for reduced system volume |
| Example 2 | 0.12 | 120.0 | 0.07 | | | Design optimized for widest slit width |

The following table shows the improvement in optical performance achieved by using aspheric surfaces:

| Optical Performance Improvement Achieved By Using Aspheric Surfaces In 1x Optical Design Form | | | | | | |
|---|---|---|---|---|---|---|
| Design | Numerical Aperture | Usable Slit Width (mm) | Wavefront Quality (λ rms) | Distortion (μm) | Telecentricity (mrad) | Comments |
| Requirement | >0.10 | >9.0 | <0.07 | <0.6 | <0.4 | See * below. |
| Example 1 (with aspheric surfaces) | 0.12 | 10.0 | 0.07 | 0.01 | 0.2 | |
| Example 1 (using only spherical surfaces) | 0.12 | 0.0 | 0.37 | 0.01 | 50.0 | This design is unable to print the required feature sizes for FPDs. |

* Requirements consistent with enabling 2.5 μm features being successfully image with a $k_1 = 0.7$ over a depth of focus of about ±10 μm. $k_1$ is a process dependent factor in microlithography.

Note that the exact optical design varies with the FPD size. In other words, if an FPD twice as large is desired, it is not necessarily the case that all the original design parameters are simply multiplied by two.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An exposure system, comprising:
   a reticle with patterns on it;
   a substrate; and
   a reflective optical system configured to image the patterns on the reticle onto the substrate, components of the reflective optical system comprising:
   a primary mirror including a first mirror and a second mirror, and
   a secondary mirror,
   wherein relative positions of the first and second mirrors of the reflective optical system are adjustable post-design, and
   wherein the optical system provides at least ten (10) degrees of freedom for both alignment and correction of aberrations without incorporating additional optical surfaces, when projecting an image of the patterns on the reticle onto the substrate by reflections off the first mirror, the secondary mirror, and the second mirror.

2. The exposure system of claim 1, wherein the first and second mirrors are concave, and the secondary mirror is convex.

3. The exposure system of claim 1, wherein the first, second, or secondary mirrors are aspheric.

4. The exposure system of claim 1, wherein a radius of curvature of the secondary mirror is approximately half of a radii of curvature of the first and second mirrors.

5. The exposure system of claim 1, wherein centers of curvature of the secondary mirror and the first and second mirrors are nominally coincident.

6. The exposure system of claim 1, wherein the centers of curvatures of the first and second mirrors are displaceable to provide fine magnification adjustment.

7. The exposure system of claim 1, wherein the centers of curvatures of the first and second mirrors are displaceable to minimize aberrations resulting from magnification adjustment.

8. The exposure system of claim 1, wherein the centers of curvatures of the first and second mirrors are displaceable to correct for any of residual optical manufacturing, coating, and mount induced errors.

9. The exposure system of claim 1, wherein the first and second mirrors have substantially same curvatures.

10. The exposure system of claim 1, further comprising:
    at least one of a first parallel glass plate optically aligned between the reticle and the first mirror and a second parallel glass plate optically aligned between the substrate and the second mirror.

11. The exposure system of claim 10, wherein either of the first and second glass plates have any of a spherical profile, an aspheric profile, a flat surface and a spherical surface, two spherical surfaces, a spherical surface and an aspherical surface, and two aspherical surfaces.

12. The exposure system of claim 11, wherein any of the spherical and aspherical surfaces have concave or convex curvatures.

13. The exposure system of claim 10, wherein either of the first or second parallel glass plates compensate for residual aberrations.

14. The exposure system of claim 1, further comprising:
    a meniscus lens near the first glass plate and between the first glass plate and the first concave mirror.

15. The exposure system of claim 14, wherein the meniscus lens has an aspheric profile on one or both of its surfaces.

16. The exposure system of claim 1, further comprising:
    at least one of a nominally flat mirror with an aspheric profile positioned at an angle to the reticle and near the reticle and a nominally flat mirror with an aspheric profile positioned at an angle to the substrate and near the substrate.

17. The exposure system of claim 16, wherein the aspheric profile is different in a vertical and horizontal axes.

18. The exposure system of claim 1, further comprising:
    at least one of a powered mirror with an aspheric profile positioned at an angle to the reticle and near the reticle and a powered mirror with an aspheric profile positioned at an angle to the substrate and near the substrate.

19. The exposure system of claim 1, wherein the first and second mirrors having centers of curvature substantially coincident with the secondary mirror.

20. The exposure system of claim 1, wherein the first and second mirrors are substantially symmetrically positioned with respect to a center of the secondary mirror.

21. The exposure system of claim 1, wherein the exposure system is included in a lithographic apparatus.

22. The exposure system of claim 1, wherein the exposure system is configured to manufacture flat panel displays.

23. The exposure system of claim 1, wherein the exposure system is configured to control telecentricity.

24. The exposure system of claim 1, wherein the optical system is configured to increase usable slit width.

25. The exposure system of claim 1, wherein the relative positions of the first and second mirrors of the reflective optical system are adjustable before or during an operation of the exposure system.

26. A method, comprising:
    projecting patterns located on a reticle onto a substrate after reflecting off a first mirror portion of a primary mirror, a secondary mirror, and a second mirror portion of the primary mirror;
    adjusting relative positions of the first and second mirrors post-design; and
    providing at least ten (10) degrees of freedom for both alignment and correction of aberrations without incorporating additional optical surfaces.

* * * * *